(12) United States Patent
Moos et al.

(10) Patent No.: US 11,302,565 B2
(45) Date of Patent: Apr. 12, 2022

(54) DEVICE FOR HANDLING A SEMICONDUCTOR WAFER IN AN EPITAXY REACTOR AND METHOD FOR PRODUCING A SEMICONDUCTOR WAFER HAVING AN EPITAXIAL LAYER

(71) Applicant: SILTRONIC AG, Munich (DE)

(72) Inventors: Patrick Moos, Pleiskirchen (DE); Hannes Hecht, Burghausen (DE)

(73) Assignee: SILTRONIC AG, Munich (DE)

( * ) Notice: Subject to any disclaimer, the term of this patent is extended or adjusted under 35 U.S.C. 154(b) by 101 days.

(21) Appl. No.: 16/309,014

(22) PCT Filed: Jul. 3, 2017

(86) PCT No.: PCT/EP2017/066437
§ 371 (c)(1),
(2) Date: Dec. 11, 2018

(87) PCT Pub. No.: WO2018/010986
PCT Pub. Date: Jan. 18, 2018

(65) Prior Publication Data
US 2019/0311941 A1    Oct. 10, 2019

(30) Foreign Application Priority Data

Jul. 13, 2016 (DE) .................... 10 2016 212 780.2

(51) Int. Cl.
*H01L 21/687* (2006.01)
*C30B 25/12* (2006.01)
*C30B 29/06* (2006.01)

(52) U.S. Cl.
CPC ........ *H01L 21/68742* (2013.01); *C30B 25/12* (2013.01); *C30B 29/06* (2013.01); *H01L 21/68792* (2013.01); *H01L 21/68785* (2013.01)

(58) Field of Classification Search
CPC ......... H01L 21/68742; H01L 21/68792; H01L 21/68785; C30B 25/12; C30B 29/06
USPC ........................................... 118/729
See application file for complete search history.

(56) References Cited

U.S. PATENT DOCUMENTS

| | | | |
|---|---|---|---|
| 6,148,762 A * | 11/2000 | Fukuda | C23C 16/4581 118/715 |
| 6,190,113 B1 | 2/2001 | Bui et al. | |
| 6,435,798 B1 | 8/2002 | Satoh | |
| 10,195,704 B2 * | 2/2019 | Himmelsbach | B23Q 7/005 |

(Continued)

FOREIGN PATENT DOCUMENTS

| | | |
|---|---|---|
| EP | 1132950 A | 9/2001 |
| JP | 07-263523 A | 10/1995 |

(Continued)

*Primary Examiner* — Charlee J. C. Bennett
(74) *Attorney, Agent, or Firm* — Brooks Kushman P.C.

(57) ABSTRACT

A device for handling a semiconductor wafer in an epitaxy reactor has a susceptor; longitudinal holes extending through the susceptor; a wafer lifting shaft; wafer lifting pins guided through the longitudinal holes; a susceptor carrying shaft; susceptor carrying arms; susceptor support pins; guide sleeves anchored in the susceptor carrying arms; and guide elements protruding from the guide sleeves which, at upper ends, have bores into which wafer lifting pins are inserted, and which can be raised and lowered together with the wafer lifting pins by the wafer lifting shaft.

12 Claims, 3 Drawing Sheets

(56) References Cited

U.S. PATENT DOCUMENTS

| | | | |
|---|---|---|---|
| 2002/0011204 A1* | 1/2002 | Gujer | C23C 16/4586 118/500 |
| 2002/0043337 A1 | 4/2002 | Goodman et al. | |
| 2003/0015141 A1* | 1/2003 | Takagi | H01L 21/67115 118/728 |
| 2003/0029571 A1* | 2/2003 | Goodman | C23C 16/4585 156/345.51 |
| 2003/0178145 A1* | 9/2003 | Anderson | H01L 21/68735 156/345.51 |
| 2004/0241992 A1* | 12/2004 | Kono | C30B 25/12 438/689 |
| 2005/0000450 A1* | 1/2005 | Iizuka | H01L 21/68742 118/728 |
| 2005/0092438 A1 | 5/2005 | Hur et al. | |
| 2006/0219178 A1 | 10/2006 | Asakura | |
| 2007/0159615 A1* | 7/2007 | Horiuchi | G03F 7/70875 355/72 |
| 2008/0124207 A1 | 5/2008 | Shimai | |
| 2010/0086784 A1 | 4/2010 | Patalay et al. | |
| 2010/0187777 A1* | 7/2010 | Hao | H01L 21/6831 279/142 |
| 2010/0212594 A1* | 8/2010 | Hara | H01L 21/67103 118/725 |
| 2014/0251208 A1* | 9/2014 | Samir | H01L 21/68792 118/500 |
| 2014/0263268 A1 | 9/2014 | Cong et al. | |

FOREIGN PATENT DOCUMENTS

| | | | |
|---|---|---|---|
| JP | 11204430 | A | 7/1999 |
| JP | 11204430 | A * | 7/1999 |
| JP | 2000124141 | A | 4/2000 |
| JP | 2002231794 | A | 8/2002 |
| JP | 2013229367 | A | 11/2013 |
| JP | 2016519208 | A | 6/2016 |
| KR | 20050042970 | A | 11/2005 |
| KR | 100660416 | B1 | 12/2006 |
| KR | 20070120890 | A | 12/2007 |
| KR | 100840971 | | 6/2008 |
| KR | 20140089106 | A * | 7/2014 |
| KR | 1020140089106 | A | 7/2014 |
| KR | 20140139935 | A | 12/2014 |
| KR | 20150006336 | A | 1/2015 |
| WO | 2014193138 | A1 | 12/2014 |

\* cited by examiner

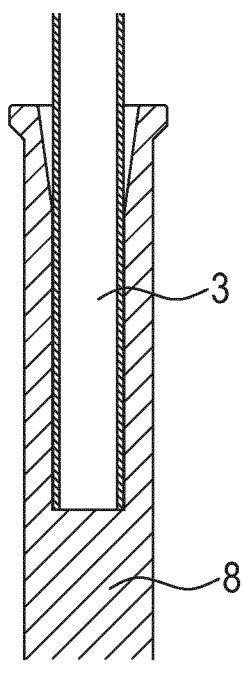
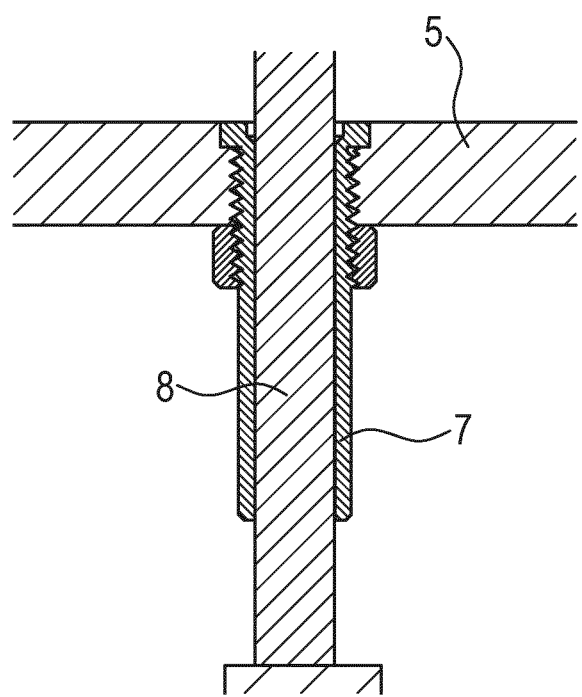
Fig. 2                    Fig. 3

DEVICE FOR HANDLING A SEMICONDUCTOR WAFER IN AN EPITAXY REACTOR AND METHOD FOR PRODUCING A SEMICONDUCTOR WAFER HAVING AN EPITAXIAL LAYER

CROSS REFERENCE TO RELATED APPLICATIONS

This application is the U.S. National Phase of PCT Appln. No. PCT/EP2017/066437 filed Jul. 3, 2017, which claims priority to German Application No. 10 2016 212 780.2 filed Jul. 13, 2016, the disclosures of which are incorporated in their entirety by reference herein.

BACKGROUND OF THE INVENTION

1. Field of the Invention

The invention relates to a device for handling a semiconductor wafer in an epitaxy reactor. The invention furthermore relates to a method for producing a semiconductor wafer having an epitaxial layer, in which the device is used.

2. Description of the Related Art

The deposition of an epitaxial layer on a semiconductor wafer is conventionally carried out by means of CVD (chemical vapor deposition) in an epitaxy reactor, often in a single-wafer reactor.

US 2014/0 251 208 A1 and US 2010/0 086 784 A1 contain descriptions of details of such epitaxy reactors. One essential part of the handling of a semiconductor wafer comprises placement of the semiconductor wafer on a susceptor before deposition of the epitaxial layer, and raising the semiconductor wafer with the epitaxial layer from the susceptor after deposition of the epitaxial layer. The device used therefor comprises, besides the susceptor, a wafer lifting shaft and wafer lifting pins, a susceptor carrying shaft, susceptor carrying arms and susceptor support pins.

The wafer lifting shaft has cross-members at the upper end, which extend laterally upward and end below the wafer lifting pins. During lowering and raising of the wafer lifting shaft, the wafer lifting pins and a semiconductor wafer, or respectively a semiconductor wafer with an epitaxial layer, possibly placed on the pins are also lowered and raised. The wafer lifting pins are in this case fitted through holes which lie in the susceptor carrying arms of the susceptor carrying shaft, as well as through through-bores in the susceptor. A disadvantage with the described device is that its use is liable to produce particles, and the particles contaminate the rear side of the semiconductor wafer, which faces toward the susceptor. The particles are formed as abraded material as a result of friction between the wafer lifting pins and the inner surfaces of the holes in the susceptor carrying arms and the through-bores in the susceptor. The friction is also due in particular to the fact that the device must remain capable of functioning in a wide temperature range, and thermal expansion at a high temperature needs to be taken into account. The wafer lifting pins are also susceptible to tilting from the vertical position. In such a situation, additional particles are formed.

This problem has given rise to the object of the invention.

SUMMARY OF THE INVENTION

Reduction of particle generation is achieved according to the invention by a device for handling a semiconductor wafer in an epitaxy reactor, comprising a susceptor;
longitudinal holes extending through the susceptor;
a wafer lifting shaft;
wafer lifting pins, which are guided through the longitudinal holes;
a susceptor carrying shaft;
susceptor carrying arms;
susceptor support pins;
guide sleeves, which are anchored in the susceptor carrying arms; and
guide elements, which protrude from the guide sleeves and, at upper ends, have bores into which the wafer lifting pins are inserted, and which can be raised and lowered together with the wafer lifting pins by means of the wafer lifting shaft. The device is used in a method for producing epitaxially coated wafers.

BRIEF DESCRIPTION OF THE DRAWINGS

FIG. 2, FIG. 3 and FIG. 4 show individual features of the device according to FIG. 1 in an enlarged representation.

DETAILED DESCRIPTION OF THE PREFERRED EMBODIMENTS

Figure 1:
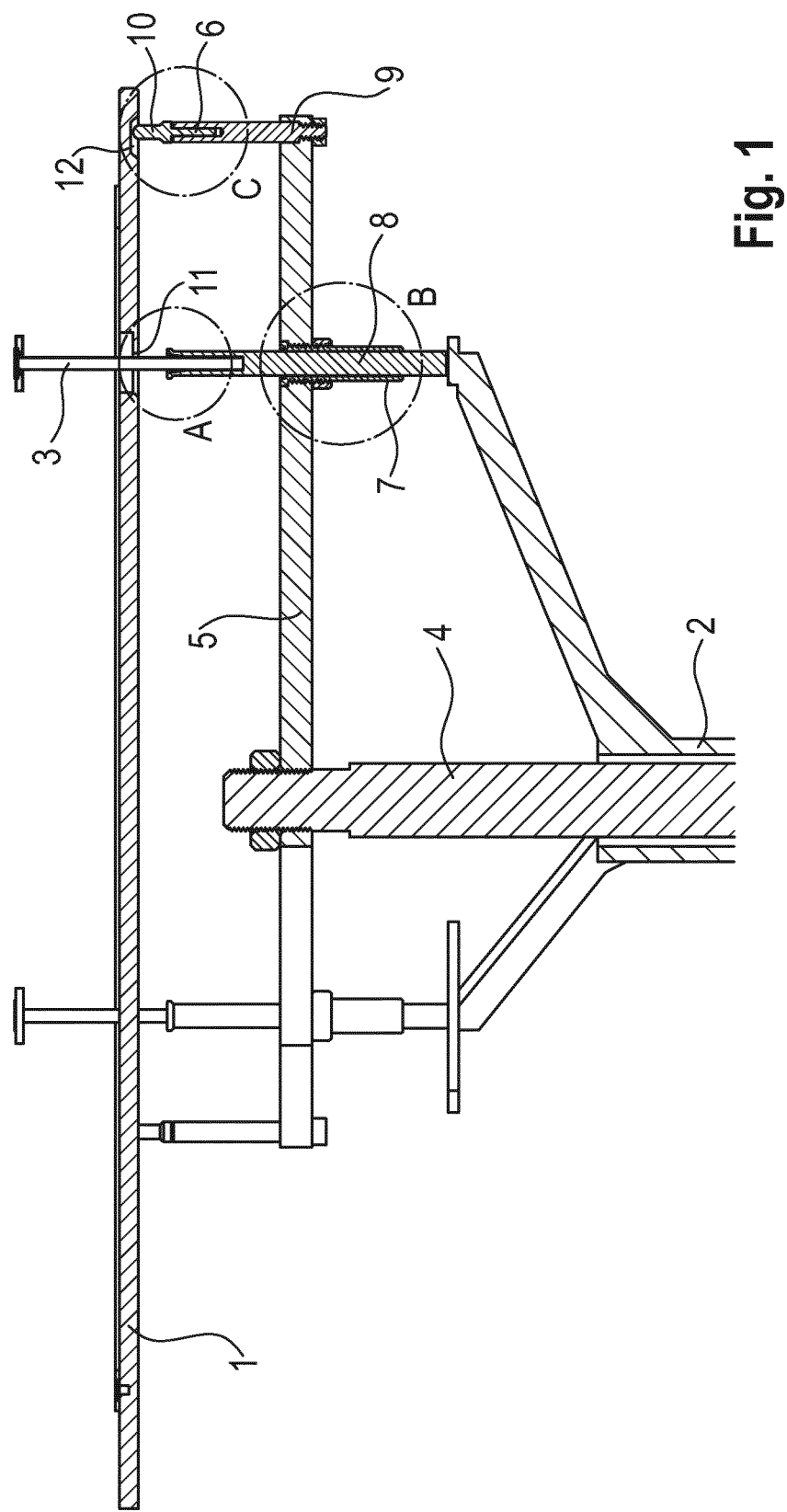
FIG. 1 is a sectional drawing through a device having the features according to the invention.

The invention is thus directed to a device for handling a semiconductor wafer in an epitaxy reactor, comprising
a susceptor;
longitudinal holes extending through the susceptor;
a wafer lifting shaft;
wafer lifting pins, which are guided through the longitudinal holes;
a susceptor carrying shaft;
susceptor carrying arms;
susceptor support pins;
guide sleeves, which are anchored in the susceptor carrying arms; and
guide elements, which protrude from the guide sleeves and, at upper ends, have bores into which the wafer lifting pins are inserted, and which can be raised and lowered together with the wafer lifting pins by means of the wafer lifting shaft.

The invention is furthermore directed to a method for producing a semiconductor wafer having an epitaxial layer, comprising
provision of a device according to the invention in an epitaxy reactor;
placement of a semiconductor wafer on the wafer lifting pins;
placement of the semiconductor wafer on the susceptor by lowering the wafer lifting pins;
deposition of the epitaxial layer on the semiconductor wafer;
raising of the resulting semiconductor wafer with the epitaxial layer from the susceptor by raising the wafer lifting pins; and
removal of the semiconductor wafer with the epitaxial layer from the epitaxy reactor.

The use of the proposed device suppresses the formation of particles in the course of the lowering of the semiconductor wafer onto the susceptor and the raising of the semiconductor wafer with the epitaxial layer from the susceptor, and in particular avoids the rear side of the semiconductor wafer, or the rear side of the semiconductor wafer with the epitaxial layer, being contaminated by particles.

Furthermore, properties such as eccentricity, radial play and vertical play of the device are minimized because of its configuration.

The device is, in particular, configured in such a way that the wafer lifting pins are moved while being linearly guided through longitudinal holes in the susceptor. Particle formation due to friction is suppressed regardless of the prevailing operating temperature.

At least three susceptor carrying arms are preferably formed by a one-piece element, which is fastened on the upper end of the susceptor carrying shaft. A star-shaped element made of quartz, which is screwed onto the susceptor carrying shaft, is particularly preferred. The star-shaped element may, however, also be in multiple parts and comprise struts made of quartz which are mounted, for example screwed, onto the susceptor carrying shaft.

Guide sleeves are anchored, preferably screwed, in the susceptor carrying arms, so that they can be replaced easily when required. The guide sleeves preferably have ground inner faces, and preferably consist of quartz. The mean roughness Ra of the inner faces is preferably not more than 0.4 μm. The guide sleeves and guide elements in the guide sleeves, which protrude out of the guide sleeves at both ends, respectively form linear sliding bearings which ensure linearly guided movement of the wafer lifting pins. The rod-shaped guide elements consist of the same material as the guide sleeves, and have outer faces whose mean roughness Ra is preferably likewise not more than 0.4 μm. Scarcely any friction therefore takes place between the guide sleeves and the guide elements, so that scarcely any particles are likewise formed, and if at all only at a position at a sufficient distance from the susceptor and a semiconductor wafer lying thereon, so that contamination of the rear side of the semiconductor wafer by particles is precluded. In particular, the arrangement of guide sleeves and guide elements and longitudinal holes prevents particles from being produced in the immediate vicinity of the semiconductor wafer during the raising and lowering of the wafer lifting pins. Furthermore, inadvertent tilting of the wafer lifting pins from the vertical position is likewise not possible.

The wafer lifting pins, which preferably have upper ends with a T-shaped cross section, are inserted into bores of the guide elements, which the guide elements have at upper ends. The wafer lifting pins and the bores of the guide elements are preferably dimensioned in such a way that the wafer lifting pins are centred when they are inserted into the bores of the guide elements at room temperature.

According to a preferred configuration, the wafer lifting pins are made of a different material with a different thermal expansion than the guide elements, preferably of silicon carbide. In this case, the manufacturing tolerances of the wafer lifting pins and of the guide elements are furthermore dimensioned in such a way that, at temperatures which arise during the deposition of the epitaxial layer, the wafer lifting pins are connected to the guide elements in a clamping fashion. Preferably, the clamping connection is obtained at temperatures of more than 900° C. Because of the clamping connection, the wafer lifting pins have no radial play, which contributes to suppressing the formation of particles.

This configuration also ensures that the wafer lifting pins and the longitudinal holes in the susceptor always remain aligned flush at least in a temperature range which extends from room temperature to the deposition temperature. Furthermore, this ensures that the T-shaped ends of the wafer lifting pins can synchronously be placed on the susceptor and raised from the susceptor.

In order to move the wafer lifting pins, the wafer lifting shaft and the guide elements, which bear on outer ends of cross-members of the wafer lifting shaft, are raised or lowered.

Furthermore, upright elements are fastened height-adjustably, preferably screwed, to the outer ends of the susceptor carrying arms. The upper ends of the upright elements have axial bores into which susceptor support pins are inserted, the heads of the latter preferably being spherically rounded. On the rear side of the susceptor, there are blind holes with an elongate base surface for receiving the spherically rounded heads of the susceptor support pins. The length and width of the blind holes increase in the direction of the opening of the blind holes. Preferably, the blind holes form a base with a prismatic contour for the susceptor support pins. This configuration allows low-friction radial movement of the susceptor, in particular a self-centering movement initiated by thermal expansion of the susceptor material.

The susceptor preferably has a plate-shaped cross section, and comprises an annular bearing surface configured as a ledge, as well as a susceptor bottom. The semiconductor wafer bears in the edge region with the rear side on the annular bearing surface, and is at a short distance from the susceptor bottom. The susceptor may be configured in one piece or formed by a ring and a flat susceptor bottom, in which case the ring bears on the flat susceptor bottom. The longitudinal holes and the blind holes are arranged in the susceptor bottom.

The features indicated in relation to the aforementioned embodiments of the method according to the invention may be applied correspondingly to the device according to the invention. Conversely, the features indicated in relation to the aforementioned embodiments of the device according to the invention may be applied correspondingly to the method according to the invention. These and other features of the embodiments according to the invention will be explained in the description of the figures and in the claims. The individual features may be implemented either separately or in combination as embodiments of the invention. Furthermore, they may describe advantageous embodiments which are independently protectable.

LIST OF REFERENCES USED 1 susceptor
2 wafer lifting shaft
3 wafer lifting pin
4 susceptor carrying shaft
5 susceptor carrying arm
6 susceptor support pin
7 guide sleeve
8 guide element
9 upright element
10 spherically rounded head
11 longitudinal hole
12 blind hole The device according to FIG. 1 comprises a susceptor carrying shaft 4 and a wafer lifting shaft 2. Susceptor carrying arms 5 with equal distances from one another are combined to form a one-piece star-shaped element, which is screwed onto the upper end of the susceptor carrying shaft 4. The wafer lifting shaft 2 comprises cross-members protruding radially upward, on the ends of which platforms are provided for supporting guide elements 8. The guide elements 8 are fitted through guide sleeves 7, which are anchored in the susceptor carrying arms 5. The upper ends of the guide elements 8 have bores, into which the wafer lifting pins 3 are inserted. The wafer lifting pins 3 extend through longitudinal holes 11 in the susceptor 1. On the rear side, the susceptor 1 has blind holes 12 with an elongate base surface, and bears there on spherically rounded heads 10 of susceptor support pins 6. The susceptor support pins 6 are inserted into axial bores at upper ends of upright elements 9. The upright elements 9 are fastened height-adjustably on the susceptor carrying arms 5 at the outer ends of the latter.

FIG. 2 shows an enlarged representation of the upper end of the guide element 8 with the bore provided there, and the lower end of the wafer lifting pin 3 inserted into the bore. This region is marked in FIG. 1 with a circle and the letter A.

FIG. 3 shows an enlarged representation of the guide sleeve 7, which is anchored in the susceptor carrying arm 5, and a part of the guide element 8, which is fitted through the guide sleeve 7 and is supported at the lower end on a platform of the cross-member of the wafer lifting shaft 2. This region is marked in FIG. 1 with a circle and the letter B.

Figure 4:
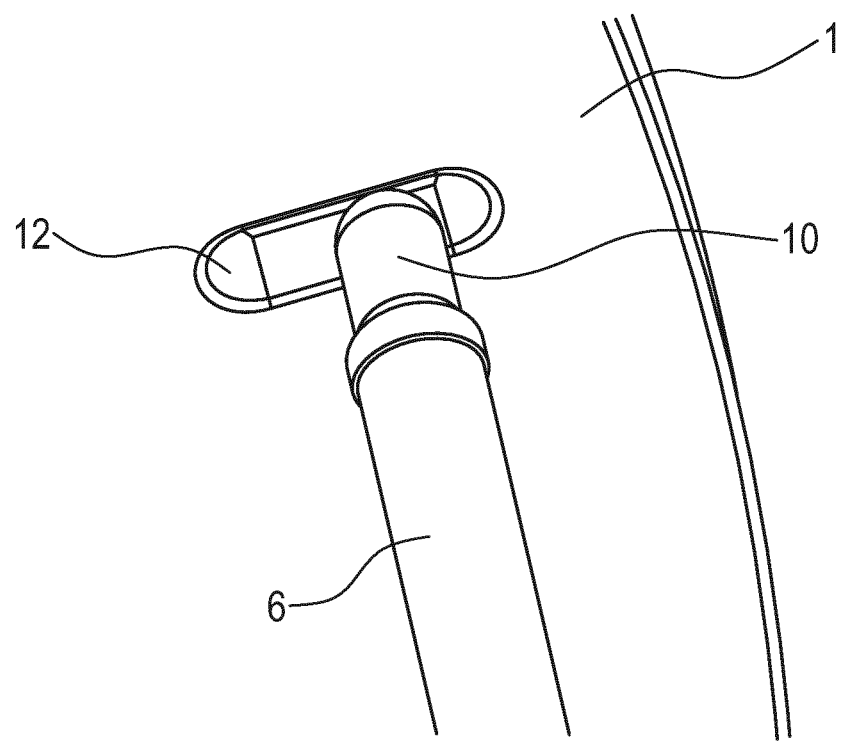

FIG. 4 shows an enlarged representation of the upper end of the susceptor support pin 6 and the spherically rounded head 10 of the susceptor support pin, which projects into the blind hole 12 on the rear side of the susceptor 1. This region is marked in FIG. 1 with a circle and the letter C.

The above description of an exemplary embodiment is to be understood by way of example. The disclosure thereby made on the one hand allows the person skilled in the art to understand the present invention and the advantages associated therewith, and on the other hand includes changes and modifications to the described structures and methods which are also obvious within the understanding of the person skilled in the art. All such changes and modifications, as well as equivalents, are therefore intended to be covered by the protective scope of the claims.

The invention claimed is:

1. A device for handling a semiconductor wafer in an epitaxy reactor, comprising:
    a susceptor;
    longitudinal holes extending through the susceptor;
    a wafer lifting shaft;
    wafer lifting pins made of silicon carbide, which are guided through the longitudinal holes;
    a susceptor carrying shaft;
    susceptor carrying arms;
    susceptor support pins;
    guide sleeves, which are anchored in the susceptor carrying arms; and
    guide elements consisting of quartz and slidable within the guide sleeves, which protrude upwardly from the guide sleeves and, at upper ends thereof, have bores into which the wafer lifting pins are inserted, and which can be raised and lowered together with the wafer lifting pins by means of the wafer lifting shaft, wherein the guide elements have a different thermal expansion as compared to the wafer lifting pins, and the wafer lifting pins and guide elements are dimensioned such that the wafer lifting pins are connected to the guide elements in a clamping fashion at temperatures greater than 900° C.

2. The device of claim 1, wherein the susceptor carrying arms form a one-piece star-shaped element, which is screwed onto an upper end of the susceptor carrying shaft.

3. The device of claim 1, wherein the clamping force is sufficient so as to prevent radial play of the wafer lifting pins.

4. The device of claim 1, wherein the wafer lifting pins self-center upon inserting into bores of the guide elements at room temperature.

5. The device of claim 1, further comprising upright elements, which are connected height-adjustably to the susceptor carrying arms at the outer ends of the latter and have axial bores into which the susceptor support pins are inserted, the susceptor support pins having spherically rounded heads.

6. The device of claim 5, further comprising elongate blind holes on a rear side of the susceptor for receiving the spherically rounded heads of the susceptor support pins, the length and width of the blind holes increasing in a direction of the opening of the blind holes.

7. A method for producing a semiconductor wafer having an epitaxial layer, comprising:
    providing a device of claim 1 an epitaxy reactor;
    placing a semiconductor wafer on the wafer lifting pins;
    placing the semiconductor wafer on the susceptor by lowering the wafer lifting pins;
    depositing an epitaxial layer on the semiconductor wafer to form an epitaxially coated semiconductor wafer;
    raising the epitaxially coated semiconductor wafer from the susceptor by raising the wafer lifting pins; and
    removing the semiconductor wafer with the epitaxial layer from the epitaxy reactor.

8. A method for producing a semiconductor wafer having an epitaxial layer, comprising:
    providing a device of claim 2 an epitaxy reactor;
    placing a semiconductor wafer on the wafer lifting pins;
    placing the semiconductor wafer on the susceptor by lowering the wafer lifting pins;
    depositing an epitaxial layer on the semiconductor wafer to form an epitaxially coated semiconductor wafer;
    raising the epitaxially coated semiconductor wafer from the susceptor by raising the wafer lifting pins; and
    removing the semiconductor wafer with the epitaxial layer from the epitaxy reactor.

9. A method for producing a semiconductor wafer having an epitaxial layer, comprising:
    providing a device of claim 3 in an epitaxy reactor;
    placing a semiconductor wafer on the wafer lifting pins;
    placing the semiconductor wafer on the susceptor by lowering the wafer lifting pins;
    depositing an epitaxial layer on the semiconductor wafer to form an epitaxially coated semiconductor wafer;
    raising the epitaxially coated semiconductor wafer from the susceptor by raising the wafer lifting pins; and
    removing the semiconductor wafer with the epitaxial layer from the epitaxy reactor.

10. A method for producing a semiconductor wafer having an epitaxial layer, comprising:
    providing a device of claim 5 in an epitaxy reactor;
    placing a semiconductor wafer on the wafer lifting pins;
    placing the semiconductor wafer on the susceptor by lowering the wafer lifting pins;
    depositing an epitaxial layer on the semiconductor wafer to form an epitaxially coated semiconductor wafer;
    raising the epitaxially coated semiconductor wafer from the susceptor by raising the wafer lifting pins; and
    removing the semiconductor wafer with the epitaxial layer from the epitaxy reactor.

11. The method of claim 7, wherein the epitaxial layer is deposited on a semiconductor wafer of monocrystalline silicon.

12. The device of claim 1, wherein a portion of the wafer lifting pin which is inserted into the bore of the guide elements is cylindrical, and the bore of the guide element which receives the lifting pin is in the form of a cylindrical bore.

* * * * *

UNITED STATES PATENT AND TRADEMARK OFFICE
CERTIFICATE OF CORRECTION

Page 1 of 1

PATENT NO. : 11,302,565 B2
APPLICATION NO. : 16/309014
DATED : April 12, 2022
INVENTOR(S) : Patrick Moos et al.

It is certified that error appears in the above-identified patent and that said Letters Patent is hereby corrected as shown below:

In the Claims

Column 6, Line 17, Claim 7:
After "providing a device of claim 1"
Insert --in--.

Column 6, Line 29, Claim 8:
After "providing a device of claim 2"
Insert --in--.

Signed and Sealed this
Twenty-seventh Day of August, 2024

Katherine Kelly Vidal
*Director of the United States Patent and Trademark Office*